(12) United States Patent
Tsumori (10) Patent No.: US 8,288,858 B2
(45) Date of Patent: Oct. 16, 2012

(54) SEMICONDUCTOR DEVICE (75) Inventor: Taku Tsumori, Miyawaka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 291 days.

(21) Appl. No.: 12/700,144

(22) Filed: Feb. 4, 2010

(65) Prior Publication Data

US 2010/0200980 A1   Aug. 12, 2010

(30) Foreign Application Priority Data

Feb. 10, 2009   (JP) .................................. 2009-028942

(51) Int. Cl.
*H01L 23/495*   (2006.01)

(52) U.S. Cl. . 257/691; 257/670; 257/692; 257/E23.124; 257/E23.031; 257/666

(58) Field of Classification Search ........... 257/E23.004, 257/672, 691, 692, E23.079, E23.124, 666–677, 257/E23.031–E23.059

See application file for complete search history.

(56) References Cited

U.S. PATENT DOCUMENTS

| 6,545,347 | B2 | 4/2003 | McClellan |
| 2007/0215990 | A1 | 9/2007 | San Antonio et al. |
| 2009/0152694 | A1* | 6/2009 | Bemmerl et al. ............. 257/670 |

FOREIGN PATENT DOCUMENTS

JP   2007-180077   7/2007

* cited by examiner

*Primary Examiner* — Mamadou Diallo (74) *Attorney, Agent, or Firm* — Turocy & Watson, LLP (57) ABSTRACT

This semiconductor device has a frame including a bed portion on which a semiconductor chip is mounted, lead groups arranged in an outer peripheral portion, first bus bars, second bus bars and a rectifying bus bar. The first bus bars and the second bus bars are arranged between the bed portion and the lead groups. The rectifying bus bar is arranged in a region where the second bus bar is not arranged. Wire bonding is not performed on the rectifying bus bar. The rectifying bus bar includes a third bus bar having at least one end joined to a lead or a hanging pin and/or a fourth bus bar formed by extending the first bus bar in an outer peripheral direction in which the leads are arranged. The semiconductor device is provided in which deformation and damage of bonding wires when molding a resin sealed body are prevented.

19 Claims, 7 Drawing Sheets

SEMICONDUCTOR DEVICE

CROSS-REFERENCE TO RELATED APPLICATIONS

This application is based upon and claims the benefit of priority from the prior Japanese Patent Application No. 2009-28942, filed on Feb. 10, 2009; the entire contents of which are incorporated herein by reference.

BACKGROUND OF THE INVENTION

Conventionally, to cope with an increase in the number of signals due to enhancement of the function of LSI, semiconductor devices of the QFP (Quad Flat Package) type are being developed. In the semiconductor device of the QFP type, since wire bonding is implemented between inner leads of a lead frame and electrodes of a semiconductor chip on a basis of one-to-one correspondence, the number of terminals that can be drawn from the semiconductor chip to the outside of the package is substantially equal to the number of inner leads, that is, the number of external terminals (pins) of the package. Therefore, in a semiconductor device incorporating a semiconductor chip requiring a number of electrodes for power supply and electrodes for grounding, the number of external terminals is increased to cope with the increase in the number of electrodes of the semiconductor chip. However, the increase in the number of external terminals leads to a problem of increasing the package size.

Further, a QFP has been proposed which is structured such that common leads (first common leads) wire-bonded to electrodes of a semiconductor chip are arranged around a chip mounting portion, second common leads each having supporting leads on its both ends and wire-bonded thereto are disposed, and resin sealing is performed (see, for example, JP-A 2007-180077 (KOKAI)).

However, in the semiconductor device in such a structure, wires (bonding wires) have been susceptible to deformation and damage due to non-uniformity in arrangement of the common leads in a molding process of a resin sealed body. Further, the leads have not always been optimally arranged, causing a problem of difficulty in reducing the inductance.

BRIEF SUMMARY OF THE INVENTION

A semiconductor device according to one aspect of the present invention comprises: a semiconductor chip having a plurality of electrodes; a bed portion on which the semiconductor chip is mounted; a plurality of leads arranged around the bed portion; a hanging pin joined to the bed portion; a first bus bar connected to an external terminal; a second bus bar having an end portion joined to at least one of the leads, and arranged between the leads and the first bus bar; a rectifying bus bar arranged in a region around the bed portion where the second bus bar is not arranged; a plurality of bonding wires electrically connecting the plurality of electrodes of the semiconductor chip to the plurality of leads, the first bus bar, and the second bus bar respectively; and a resin sealed body sealing the semiconductor chip, the bed portion, the first bus bar, the second bus bar, the rectifying bus bar, and the bonding wires.

DETAILED DESCRIPTION OF THE INVENTION

Hereinafter, embodiments for implementing the present invention will be described. Note that the embodiments will be described with reference to the drawings in the following description, but those drawings are provided merely for graphic illustration, and the present invention is not limited to those drawings.

Figure 1A:
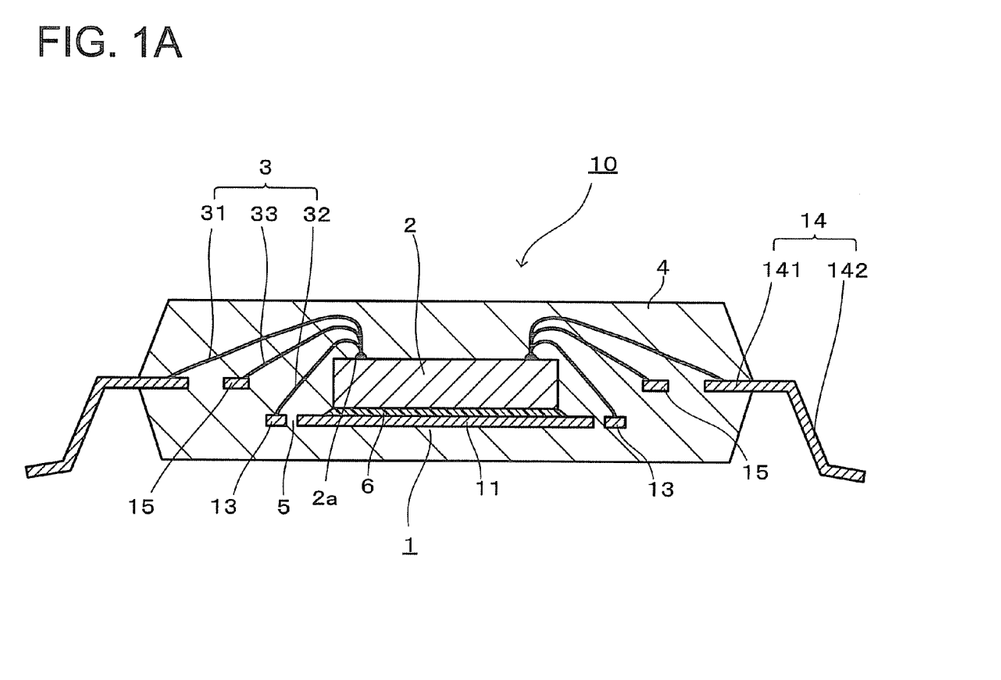
FIG. 1A and FIG. 1B are longitudinal sectional views showing structures of a first embodiment of a semiconductor device according to the present invention.
Figure 1B:
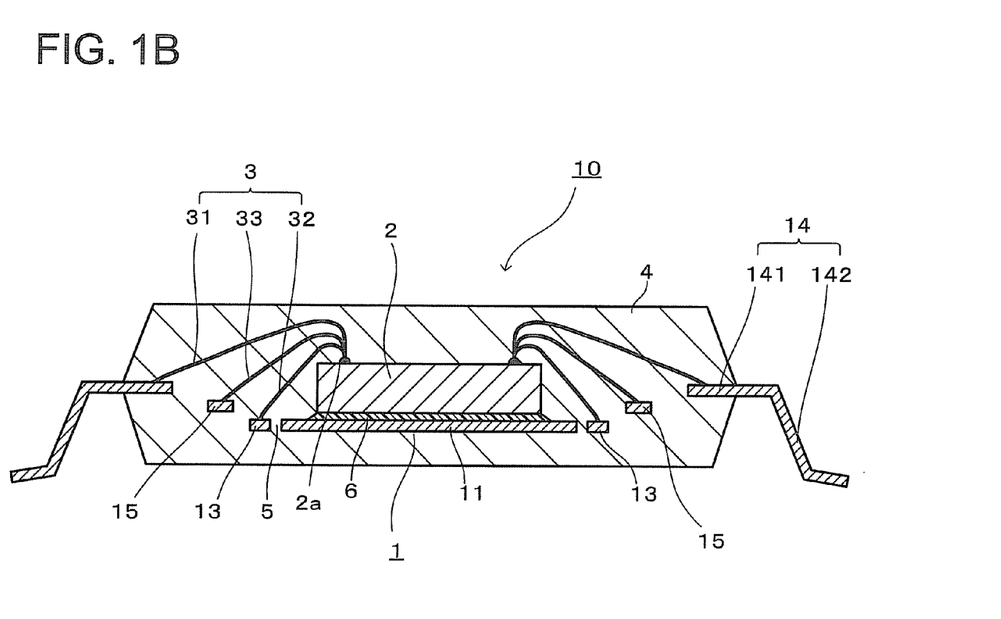
Figure 2:
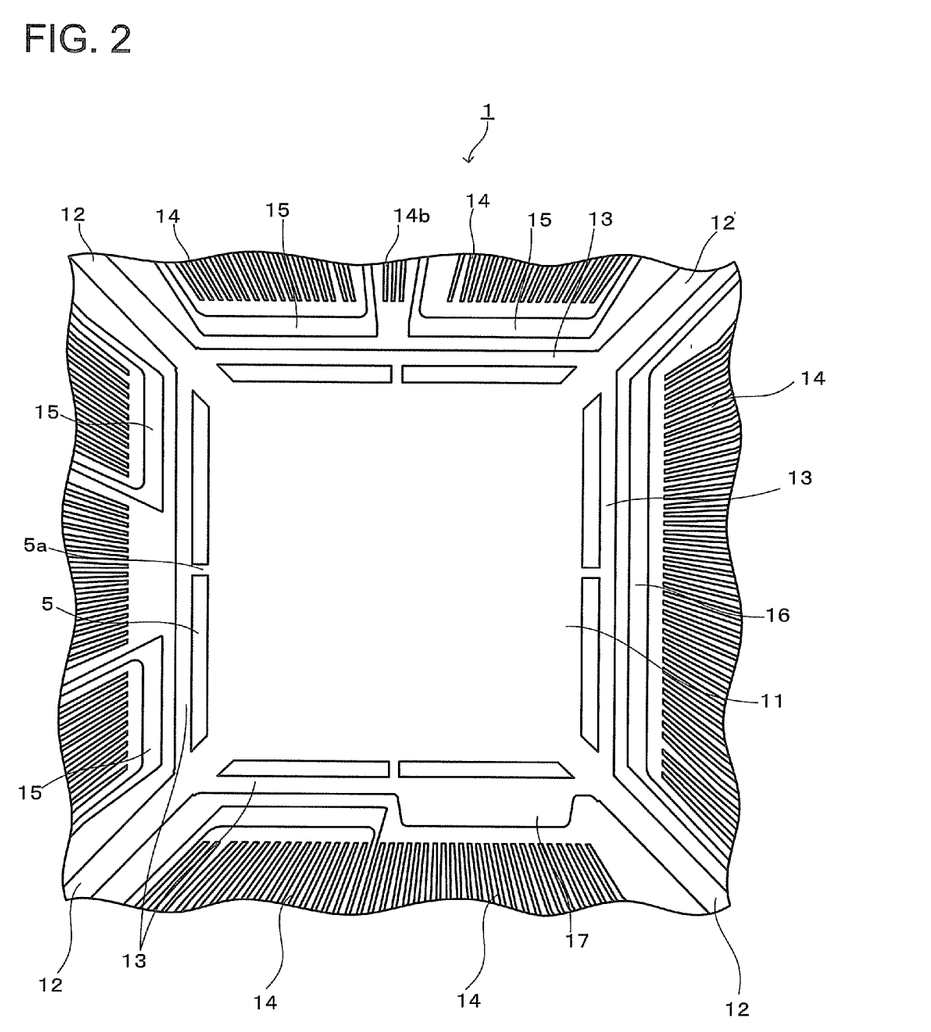
FIG. 2 is a plan view showing a shape of a frame used in the semiconductor device of the first embodiment.

FIG. 1A and FIG. 1B are longitudinal sectional views showing a first embodiment of a semiconductor device according to the present invention, and FIG. 2 is a plan view showing a shape of a frame (lead frame) used in the semiconductor device of the first embodiment. Note that the semiconductor device of the first embodiment will be described taking a QFP as an example, but the semiconductor device of the present invention is not limited to the QFP.

The semiconductor device (QFP) 10 of the first embodiment includes a frame (a lead frame) 1 having a shape illustrated below, a semiconductor chip 2 mounted on a bed portion (a stage portion) 11 of the frame 1, bonding wires 3 electrically connecting electrodes 2a of the semiconductor chip 2 to portions of the frame 1, and a resin sealed body 4 sealing the portions of the frame 1, the semiconductor chip 2, and the bonding wires 3.

The frame 1 has the bed portion 11 in a rectangular shape slightly larger than a main surface of the semiconductor chip 2, four hanging pins 12 joined to four corners of the bed portion 11, first bus bars 13 provided adjacent to outer peripheries of four sides of the bed portion 11 via slits 5 respectively, a plurality of leads 14 (lead groups) arranged outside the first bus bars 13 at the four sides of the bed portion 11, and a second bus bar 15 arranged between the lead group and the first bus bar 13 at least one side (for example, three sides) of the bed portion 11. Further, this frame 1 has rectifying bus bars in regions around the bed portion 11 where the second bus bar 15 is not arranged. The rectifying bus bars are bus bars having a function of rectifying the flow of a sealing resin in a molding process, and include later-described third bus bar 16 and fourth bus bar 17.

The third bus bar 16 and the fourth bus bar 17 which are the rectifying bus bars can be arranged in a region when the width (length) of the region where the second bus bar 15 is not arranged is 0.8 mm or more. In other words, even when two or more second bus bars 15 are arranged on the same side around the bed portion 11, if there is a space of 0.8 mm or more between the second bus bars 15, the third bus bar 16 and/or the fourth bus bar 17 can be arranged in the space region.

The hanging pin 12 is a member hanging and supporting the bed portion 11 that is the mounting portion for the semiconductor chip 2. To the hanging pin 12, a neighboring lead is joined to supply a potential to the first bus bar joined to the hanging pin 12. Note that the illustration of a joint portion where the neighboring lead is joined to the hanging pin 12 is omitted.

The lead group composed of a plurality of leads 14 is arranged projecting from a side peripheral portion of the resin sealed body 4. Each of the leads 14 has an inner lead portion 141 embedded in the resin sealed body 4 and an outer lead portion 142 exposed from the resin sealed body 4 and functioning as a connecting terminal to an external part.

The first bus bar 13 is arranged, for example, at the same height as the bed portion 11, and has ends joined to the respective hanging pins 12. To the hanging pin 12, the neighboring lead is joined, so that a potential is supplied to the first bus bar 13 via the lead. Preferably, a ground potential is supplied (applied) to the first bus bar 13. Note that the first bus bars 13 are preferably arranged at the four sides of the bed portion 11, but the first bus bar 13 is only necessary to be arranged at least one side.

The slit 5 separating the first bus bar 13 from the bed portion 11 serves to prevent a bonding failure of the bonding wire 3 due to flow of an adhesive (a die-bonding material) 6 bonding the semiconductor chip 2 to the bed portion 11. More specifically, the slit 5 is formed between the first bus bar 13 and the bed portion 11, so that even if the adhesive 6 flows to the outside of the bed portion 11, the adhesive 6 never adheres to the first bus bar 3. Accordingly, a failure of wire bonding to the first bus bar 13 due to the adherence of the adhesive 6 is prevented. Further, since bite between resins (the bonding property between upper and lower resin layers) is improved, the adhesiveness of the resin to the first bus bar 13 is improved to make it harder for the resin sealed body 4 to peel off.

At a middle portion in the length direction (a direction along the outer periphery of the bed portion 11) of the slit 5, a tie bar 5a coupling the bed portion 11 and the first bus bar 13 is formed. This tie bar 5a serves to suppress the movement of the first bus bar 13 when the bonding wire 3 is connected to the first bus bar 13. This prevents shift and twist of the first bus bar 13, thereby preventing a connection failure of the bonding wire 3.

The second bus bar 15 is arranged between the lead group 14 and the first bus bar 13 which are arranged on the same side of the bed portion 11, and has an end portion joined to at least one lead of the lead group 14 (for example, has one end portion joined to the lead 14 adjacent to the hanging pin 12 and another end portion joined to the lead arranged at the middle portion, respectively). It is preferable to supply a power supply potential to the second bus bar 15.

The second bus bar 15 may be arranged at the same height as the lead 14 as shown in FIG. 1A, or may be arranged at a position lower than the lead 14 as shown in FIG. 1B. More specifically, the height of the second bus bar 15 can be arbitrarily adjusted to an intermediate height between heights of the lead 14 and the bed portion 11. In particular, a structure in which the second bus bar 15 is arranged lower than the lead 14 provides an advantage that even if the bonding wire 3 (a first bonding wire 31) connected to the lead 14 sags down, the bonding wire 3 hardly comes into contact with the second bus bar 15.

The second bus bar 15 can be arranged at least one side around the bed portion 11, and one or two or more second bus bars 15 can be arranged on the same side. Further, two second bus bars 15 can be arranged on the same side of the bed portion 11 with a plurality of leads 14b sandwiched between them. In such arrangement, it is preferable to connect the ground potential to at least one of the leads 14b put between the second bus bars 15. The arrangement of the leads 14b at the ground potential between the two second bus bars 15 to which the power supply voltage is supplied can reduce the inductance of the second bus bars 15.

Further, in the lead arrangement in which the plurality of (for example, three) leads 14b are sandwiched between the two second bus bars 15, the inductances of the second bus bars 15 can be reduced by bringing at least the leads adjacent to the second bus bars 15 among the plurality of leads 14b arranged between the second bus bars 15, to the ground potential.

In the first embodiment, the third bus bar 16 being one of the rectifying bus bars is arranged at the whole of a side of the bed portion 11 where the second bus bar 15 is not arranged, for example, at the same height as the second bus bar 15, and has both ends respectively joined to two leads 14 arranged at both end portions of a region of the side. The third bus bar 16 may be arranged at the same height as the lead 14 or may be arranged at a position lower than the lead 14, similarly to the second bus bar 15. Especially, a structure in which the third bus bar 16 is arranged lower than the lead 14 provides an advantage that even if the bonding wire 3 (the first bonding wire 31) connected to the lead 14 sags down, the bonding wire 3 hardly comes into contact with the third bus bar 16.

The third bus bar 16 is a bus bar arranged to rectify the flow of the sealing resin in the molding process as a dummy of the second bus bar 15. Therefore, later-described wire bonding is not performed on the third bus bar 16, and thus any potential is not applied thereto.

Figure 3:
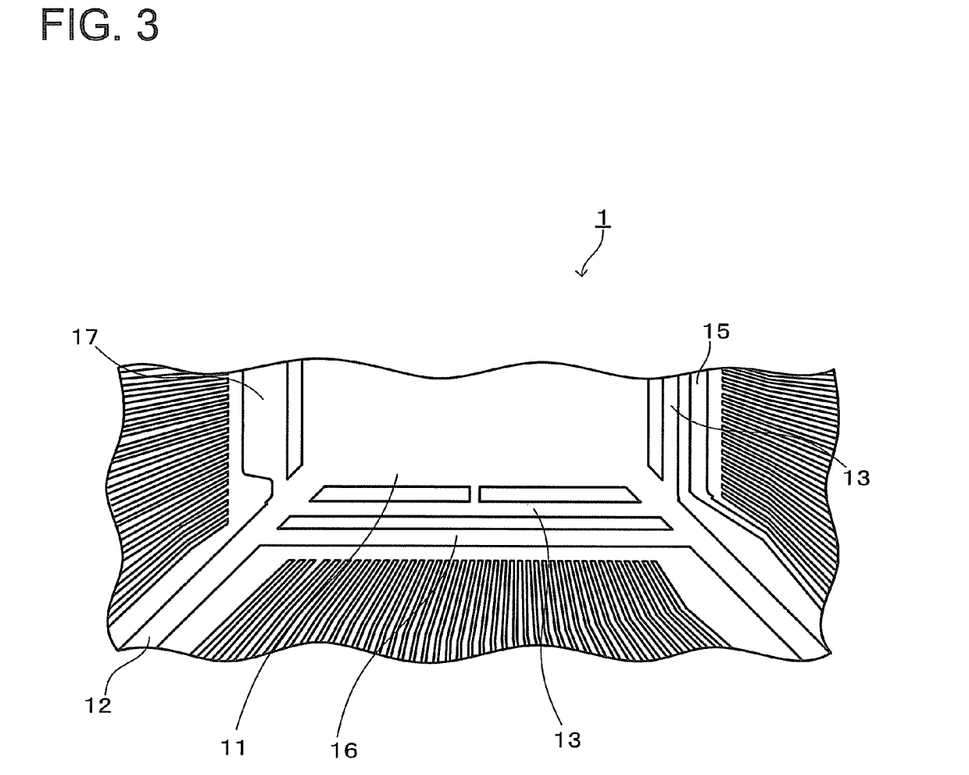
FIG. 3 is a partial plan view showing another shape of a third bus bar in the frame of the semiconductor device of the first embodiment.

The third bus bar 16 arranged on the whole of a side of the bed portion 11 where the second bus bar 15 is not arranged may be formed having both ends joined to the hanging pins 12 which are as supporters of the third bus bar 16 as shown in FIG. 3.

By arranging such a third bus bar 16, the flow of the sealing resin is rectified in the molding process of the resin sealed body 4, thereby preventing deformation and damage of the bonding wire 3. More specifically, by arranging the third bus bar 16 in the region where the second bus bar 15 is not arranged, the pattern (shape) of the frame 1 around the bed portion 11 is equalized, so that the flow of the sealing resin in the molding process is rectified to be equal at portions around the bed portion 11. This avoids the bonding wire 3 from being deformed or damaged due to non-uniformity of the resin flow or the like.

Figure 4:
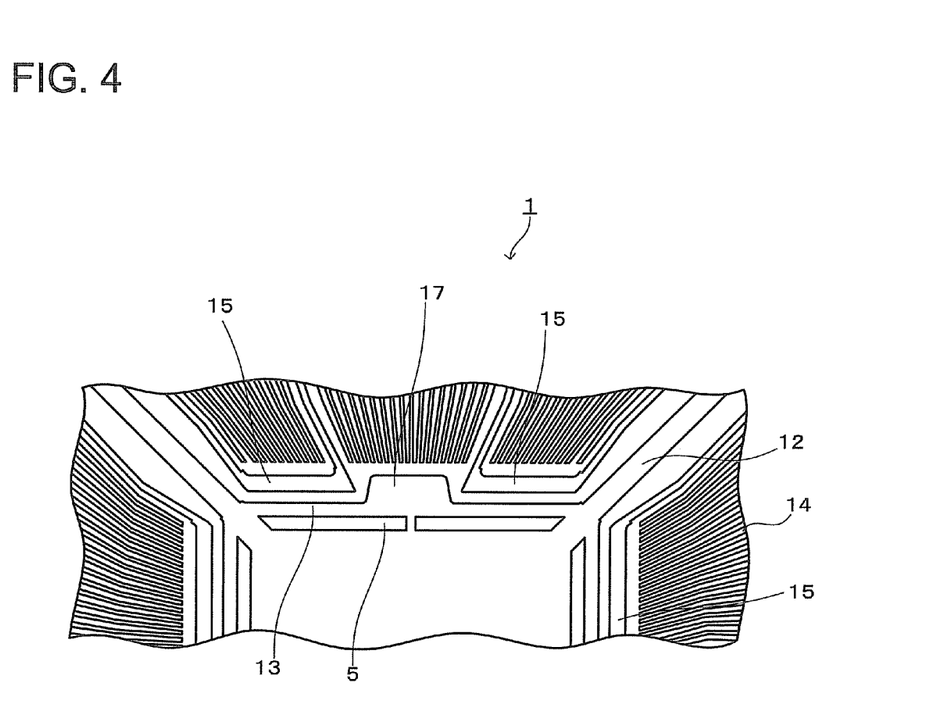
FIG. 4 is a partial plan view showing another shape of a fourth bus bar in the frame of the semiconductor device of the first embodiment.

The fourth bus bar 17 is formed by extending the first bus bar 13 to the lead 14 side (the outer periphery side), for example, at the same height, and arranged in the region where the second bus bar 15 is not arranged. The fourth bus bar 17 can be arranged not only when the region where the second bus bar 15 is not arranged is a part of a side of the bed portion 11. Also when the region where the second bus bar 15 is not arranged is the whole of a side of the bed portion 11, the fourth bus bar 17 can be arranged in the region of the whole of the side. Further, as shown in FIG. 4, even in the case where two second bus bars 15 are arranged on the same side around the bed portion 11, if there is a space of a predetermined size (0.8 mm) or more between the second bus bars 15, the fourth bus bar 17 can be arranged in the space region. The fourth bus bar 17 is a bus bar arranged to rectify the flow of the sealing resin in the molding process as a dummy of the second bus bar 15, and therefore no bonding wire is connected to the fourth bus bar 17.

By arranging such a fourth bus bar 17, the flow of the sealing resin in the molding process of the resin sealed body 4 is rectified to prevent deformation and damage of the bonding wire 3. More specifically, by arranging the fourth bus bar 17 in the region where the second bus bar 15 is not arranged, the pattern (shape) of the frame 1 around the bed portion 11 is equalized, so that the flow of the sealing resin in the molding process is rectified to be equal at portions around the bed portion 11. This avoids the bonding wire 3 from being deformed or damaged due to non-uniformity of the resin flow or the like.

In the semiconductor device 10 of the first embodiment, the semiconductor chip 2 having a plurality of electrodes (pads) 2a is mounted on the bed portion 11 of the frame 1 having the above-described shape and structure. The semiconductor chip 2 is bonded to the bed portion 11 of the frame 1 by the adhesive 6 such as a die-bonding material. Note that two semiconductor chips 2 (for example, a semiconductor chip having an arithmetic processing function and a semiconductor chip having a memory function) may be mounted at two tiers to be stacked one on top of the other. Further, it is also possible to arrange two or more semiconductor chips 2 side by side on the bed portion 11.

Figure 5:
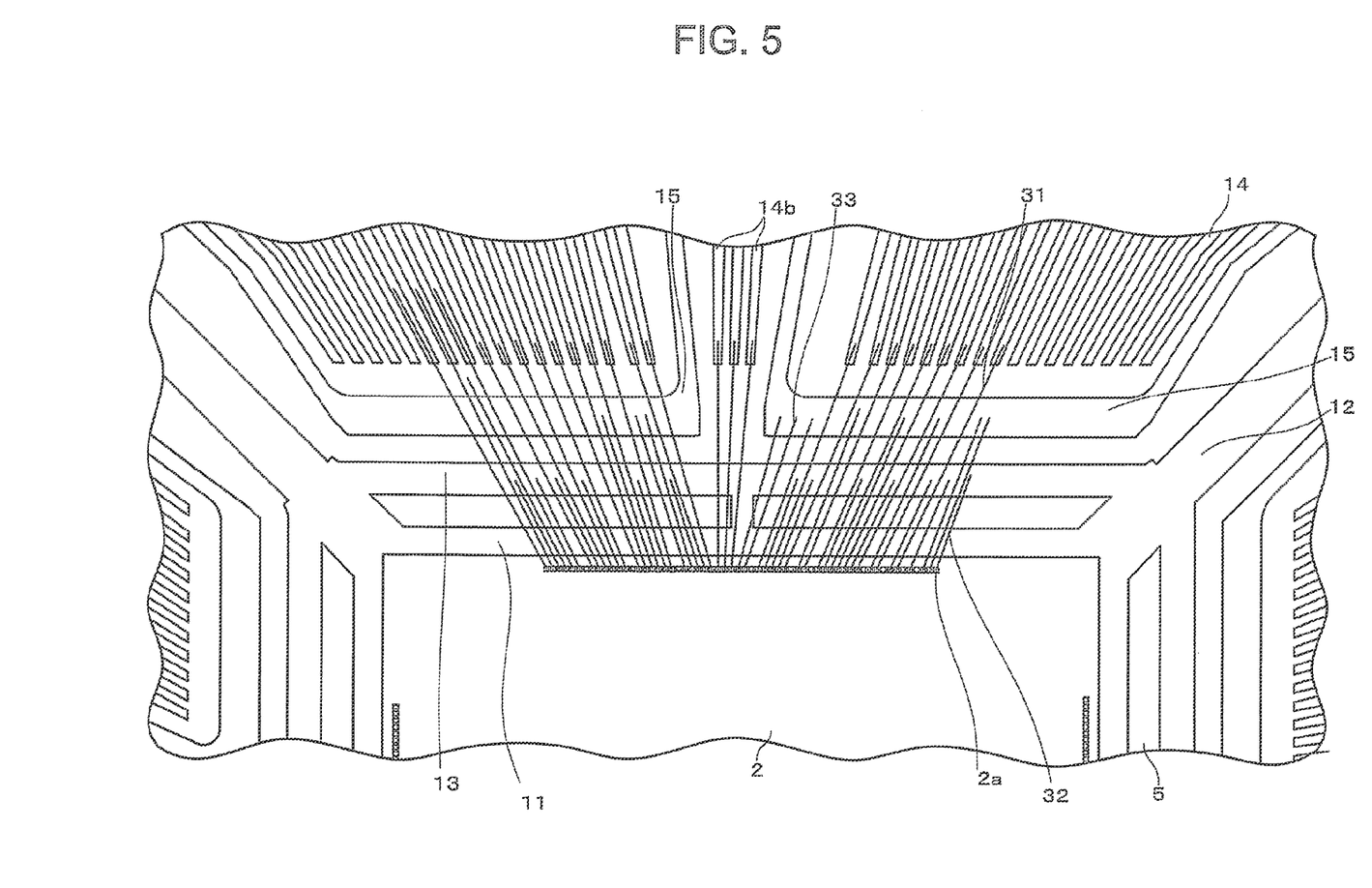
FIG. 5 is a partial plan view showing the first embodiment of the semiconductor device, in which a semiconductor chip has been mounted and wire bonding has been implemented.

As shown in FIG. 5, predetermined electrodes among many electrodes 2a of the semiconductor chip 2 are electrically connected to a plurality of leads 14 by the first bonding wires 31 respectively. Further, apart of the electrodes 2a for grounding of the semiconductor chip 2 are electrically connected to the first bar 13 to which the ground potential is applied, via second bonding wires 32 respectively, and a part of the electrodes 2a for power supply are electrically connected to the second bar 15 to which the power supply potential is applied, via third bonding wires 33 respectively. As the first, second, and third bonding wires 31, 32, and 33, a gold wire or another conductive metal wire is used.

Portions of the frame 1, the semiconductor chip 2, and the first, second, and third bonding wires 31, 32 and 33 are sealed by the resin sealed body 4. The resin sealed body 4 is composed of a thermosetting epoxy resin or the like.

Next, a method of manufacturing the semiconductor device (QFP) 10 of the first embodiment will be described. To begin with, a frame 1 having the shape shown in FIG. 2 is prepared. This frame 1 has a rectangular bed portion 11; four hanging pins 12 joined to four corners of the bed portion 11 respectively; first bus bars 13 provided adjacent to the outer peripheries at four sides of the bed portion 11 via slits 5 respectively; a plurality of leads 14 (lead groups) arranged around the first bus bars 13 at the four sides of the bed portion 11; second bus bars 15 arranged between the lead groups 14 and the first bus bars 13 at three sides of the bed portion 11; a third bus bar 16 arranged at the whole of the side where the second bus bar 15 is not arranged around the bed portion 11; and a fourth bus bar 17 arranged in a region where the second bus bar 15 is not arranged, at the side where the second bus bar 15 is arranged at a part of the whole of the side.

Further, a semiconductor chip 2 having a plurality of electrodes 2a formed on a main surface (a semiconductor element formation surface) is prepared.

Then, the semiconductor chip 2 is bonded to the bed portion 11 of the frame 1 via an adhesive 6 such as a die-bonding material.

Subsequently, wire bonding is performed. More specifically, the plurality of electrodes 2a of the semiconductor chip 2 are connected to the plurality of leads 14 (inner lead portions 141) by the first bonding wires 31 respectively. Further, predetermined electrodes 2a for grounding of the semiconductor ship 2 are connected by the second bonding wires 32 to the first bus bars 13 to which the ground potential is applied, and predetermined electrodes 2a for power supply are connected by third bonding wires 33 to the second bus bars 15 to which the power supply potential is applied.

Subsequently, the semiconductor chip 2, and wire bonding portions between the electrodes 2a of the semiconductor chip 2 and the leads 14, the first bus bars 13, and the second bus bars 15 are sealed by a method of molding the thermosetting epoxy resin or the like using a mold to form a resin sealed body 4. Finally, the leads 14 projecting from the outer peripheral surface of the resin sealed body 4 are cut and formed into a shape of gull-wing, and the manufacturing process is finished.

In the semiconductor device (QFP) 10 of the first embodiment configured as described above, the first bus bars 13 and the second bus bars 15 are arranged between the bed portion 11 on which the semiconductor chip 2 is mounted and the lead groups 14 arranged at the outer peripheral portion, and the third bus bar 16 and the fourth bus bar 17 rectifying the flow of the sealing resin in the molding process are arranged in the regions where the second bus bar 15 is not arranged around the bed portion 11, so that deformation and damage of the bonding wire 3 when molding the resin sealed body 4 can be prevented to suppress interference between the bonding wires 3.

Specifically, comparing the wire sweep rates when molding the resin sealed body 4 (for a wire length of 3 mm), the wire sweep rate of a semiconductor device having a frame with no rectifying bus bar was 6.5%, whereas the wire sweep rate of the semiconductor device of the first embodiment having rectifying bus bars (the third bus bar 16 and the fourth bus bar 17) was 3.4%. It was confirmed that by arranging the rectifying bus bars, the deformation (sweep) of wires in the molding process of the resin sealed body can be greatly suppressed and deformation and damage of the bonding wires 3 can be suppressed.

Further, in the semiconductor device (QFP) 10 of the first embodiment, a plurality of the electrodes 2a of the semiconductor chip 2 are connected to each of the first bus bars 13 and the second bus bars 15 by the bonding wires 3 (the second bonding wires 32 and the third bonding wires 33) so that many bonding wires 3 can be bonded to the first and second bus bars 13 and 15, thereby coping with an increase in the number of electrodes of the semiconductor chip 2 to supply sufficient potential without increasing the number of leads 14 which are external terminals. Therefore, the device size can be suppressed to small.

Though the example in which both the third bus bar 16 and the fourth bus bar 17 are provided has been described in the first embodiment, sufficient effects can be achieved only by arranging one of the third bus bar 16 and the fourth bus bar 17. Further, the third bus bar 16 can be arranged not only at the whole of a side of the bed portion 11 where the second bus bar 15 is not arranged but also at a part of the side. Embodiments in which the third bus bar 16 is arranged at a part of a side of the bed portion 11 are shown in FIG. 6 and FIG. 7.

Figure 6:
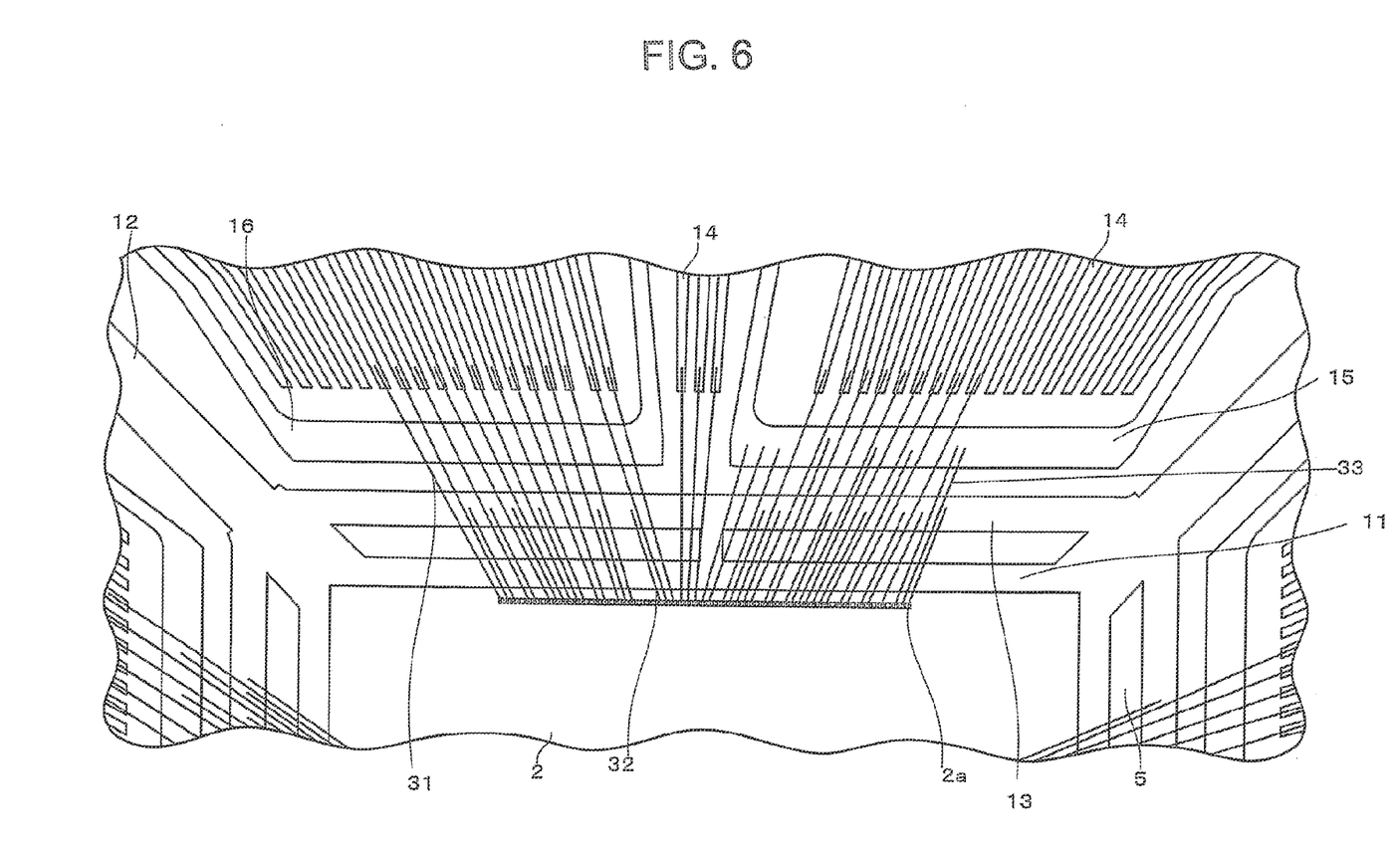
FIG. 6 is a partial plan view showing a second embodiment of a semiconductor device according to the present invention, in which a semiconductor chip has been mounted and wire bonding has been implemented.
Figure 7:
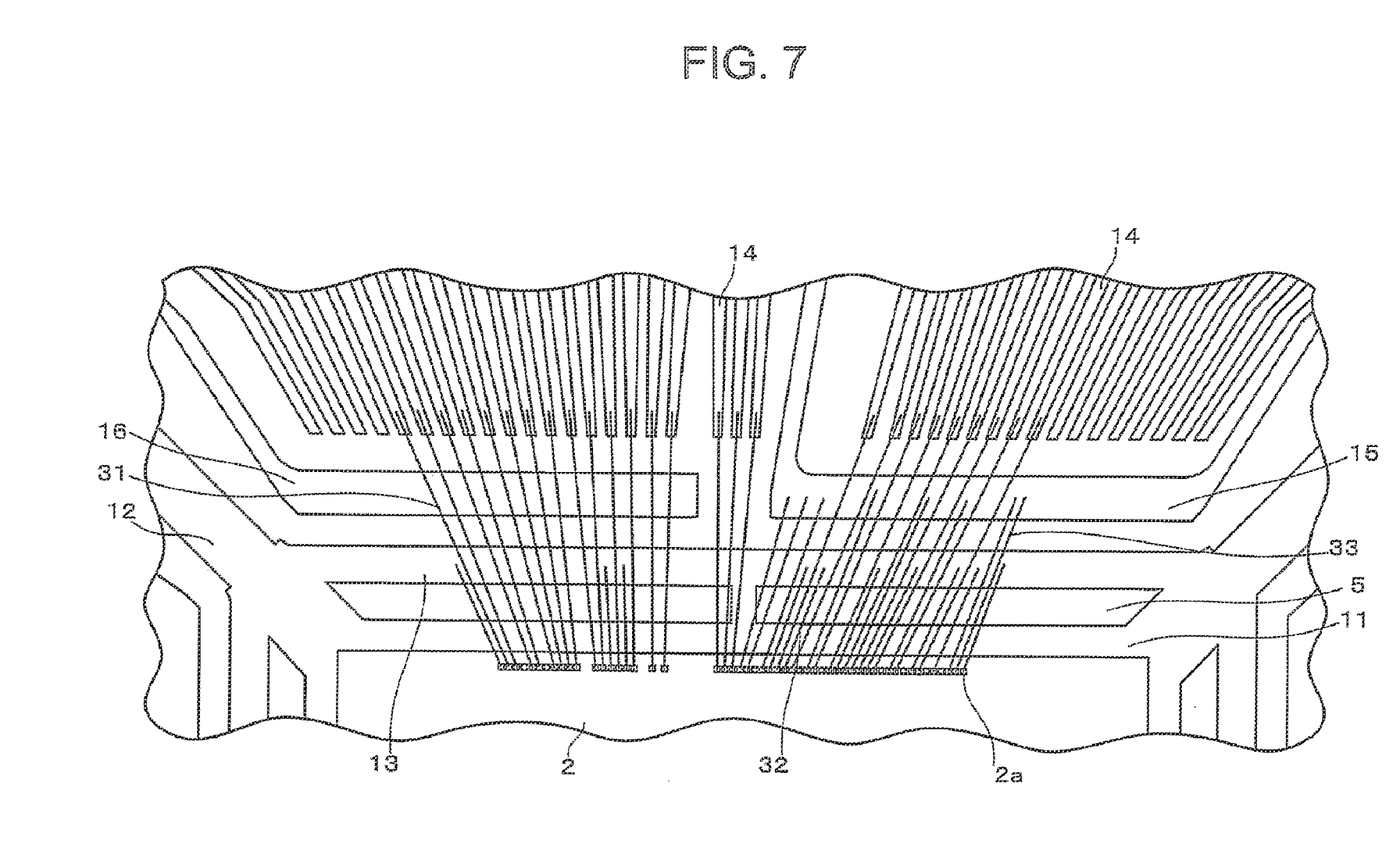
FIG. 7 is a partial plan view showing a third embodiment of a semiconductor device according to the present invention, in which a semiconductor chip has been mounted and wire bonding has been implemented.

In each of second and third embodiments shown in FIG. 6 and FIG. 7, the second bus bar 15 of the frame 1 is arranged at a part of a side of the bed portion 11, and the third bus bar 16 is arranged in a region of a part of the side where the second bus bar 15 is not arranged. In the semiconductor device of the second embodiment shown in FIG. 6, both ends of the third bus bar 16 are joined respectively to two leads 14 arranged in the region where the second bus bar 15 is not arranged. Further, in the semiconductor device of the third embodiment shown in FIG. 7, only one of end portions of the third bus bar 16 is joined to one lead 14 arranged in the region where the second bus bar 15 is not arranged, and the other end portion is not joined to any lead 14 or any hanging pin 12 but is free.

Since wire bonding is not implemented on the third bus bar 16, there is no problem in strength even in the structure in which the end portion only one side is joined to and supported by the lead 14. In FIG. 6 and FIG. 7, the same numbers are given to the same portion as those in FIG. 5 and explanation of those portions is omitted.

Also in the semiconductor devices of the second and third embodiments, deformation and damage of the bonding wires 3 when molding the resin sealed body can be prevented to suppress interference between the bonding wires 3.

The structure, shape, size, and positional relation described in the above embodiments are merely schematically illustrated, and the compositions (materials) of the structures are merely illustrative. Therefore, the present invention is not limited to the above embodiments but can be modified into various forms without departing from the scope of the technical idea set forth in claims.

What is claimed is:

1. A semiconductor device, comprising:
    a semiconductor chip having a plurality of electrodes;
    a bed portion on which the semiconductor chip is mounted;
    a plurality of leads arranged around the bed portion;
    a hanging pin joined to the bed portion;
    a plurality of first bus bars arranged at four sides of the bed portion and connected to an external terminal;
    at least one second bus bar having an end portion joined to at least one of the plurality of leads, and arranged between the plurality of leads and the plurality of first bus bars;
    a rectifying bus bar arranged in a region around the bed portion where the at least one second bus bar is not arranged;
    a plurality of bonding wires electrically connecting the plurality of electrodes of the semiconductor chip to the plurality of leads, the plurality of first bus bars, and the at least one second bus bar, respectively; and
    a resin sealed body sealing the semiconductor chip, the bed portion, the plurality of first bus bars, the at least one second bus bar, the rectifying bus bar, and the plurality of bonding wires.

2. The semiconductor device as set forth in claim 1,
    wherein the plurality of first bus bars are joined to the hanging pin, and the hanging pin is connected to the external terminal via one of the plurality of leads.

3. The semiconductor device as set forth in claim 1,
    wherein a slit is formed between the plurality of first bus bars and the bed portion, and the plurality of first bus bars are separated from the bed portion.

4. The semiconductor device as set forth in claim 3,
    wherein in the slit, a tie bar coupling the plurality of first bus bars and the bed portion is provided at a middle portion in a length direction along an outer periphery of the bed portion.

5. The semiconductor device as set forth in claim 1,
    wherein the at least one second bus bar is arranged at a same height as the at least one of the plurality of leads or arranged at a position lower than the at least one of the plurality of leads.

6. The semiconductor device as set forth in claim 1,
    wherein two or more of the at least one second bus bar are arranged around the bed portion, and one or more of the plurality of leads are arranged between the two or more of the at least one second bus bar, and at least one of the one or more of the plurality of leads is held at a ground potential.

7. The semiconductor device as set forth in claim 1,
    wherein a region where the at least one second bus bar is not arranged but the rectifying bus bar is arranged has a width or length of 0.8 millimeters (mm) or more.

8. The semiconductor device as set forth in claim 1,
    wherein the rectifying bus bar is a third bus bar having at least one end portion joined to the at least one of the plurality of leads or the hanging pin.

9. The semiconductor device as set forth in claim 1,
    wherein the rectifying bus bar is a fourth bus bar formed by extending the plurality of first bus bars in an outer periphery direction in which the plurality of leads are arranged.

10. The semiconductor device as set forth in claim 1, further comprising:
    as the rectifying bus bar, a third bus bar having at least one end portion joined to the at least one of the plurality of leads or the hanging pin, and a fourth bus bar formed by extending the plurality of first bus bars in an outer peripheral direction in which the plurality of leads are arranged.

11. A semiconductor device, comprising:
    a semiconductor chip having a plurality of electrodes;
    a bed portion on which the semiconductor chip is mounted;
    a plurality of leads arranged around the bed portion;
    a hanging pin joined to the bed portion;
    a first bus bar connected to an external terminal;
    a plurality of second bus bars respectively having an end portion joined to at least one of the plurality of leads, and arranged around the bed portion between the plurality of leads and the first bus bar;
    a rectifying bus bar arranged in a region around the bed portion where the plurality of second bus bars are not arranged;
    one or more of the plurality of leads being arranged between the plurality of second bus bars, and at least one of the plurality of leads being held at a ground potential;
    a plurality of bonding wires electrically connecting the plurality of electrodes of the semiconductor chip to the plurality of leads, the first bus bar, and the plurality of second bus bars, respectively; and
    a resin sealed body sealing the semiconductor chip, the bed portion, the first bus bar, the plurality of second bus bars, the rectifying bus bar, and the bonding wires.

12. The semiconductor device as set forth in claim 11,
    wherein the first bus bar is joined to the hanging pin, and the hanging pin is connected to the external terminal via one of the plurality of leads.

13. The semiconductor device as set forth in claim 11,
    wherein a slit is formed between the first bus bar and the bed portion, and the first bus bar is separated from the bed portion.

14. The semiconductor device as set forth in claim 13,
    wherein in the slit, a tie bar coupling the first bus bar and the bed portion is provided at a middle portion in a length direction along an outer periphery of the bed portion.

15. The semiconductor device as set forth in claim 11,
    wherein the plurality of second bus bars are arranged at a same height as the at least one of the plurality of leads or arranged at a position lower than the at least one of the plurality of leads.

16. The semiconductor device as set forth in claim 11,
    wherein a region where the plurality of second bus bars are not arranged but the rectifying bus bar is arranged has a width or length of 0.8 millimeters (mm) or more.

17. The semiconductor device as set forth in claim 11,
wherein the rectifying bus bar is a third bus bar having at least one end portion joined to the at least one of the plurality of leads or the hanging pin.

18. The semiconductor device as set forth in claim 11,
wherein the rectifying bus bar is a fourth bus bar formed by extending the first bus bar in an outer peripheral direction in which the plurality of leads are arranged.

19. The semiconductor device as set forth in claim 11, further comprising:
as the rectifying bus bar, a third bus bar having at least one end portion joined to the at least one of the plurality of leads or the hanging pin, and a fourth bus bar formed by extending the first bus bar in an outer peripheral direction in which the plurality of leads are arranged.

\* \* \* \* \*